(12) United States Patent
Garcia

(10) Patent No.: US 7,663,743 B2
(45) Date of Patent: Feb. 16, 2010

(54) SENSING SYSTEM

(75) Inventor: Alan Torres Garcia, Singapore (SG)

(73) Assignee: Systems On Silicon Manufacturing Co. Pte. Ltd., Singapore (SG)

( * ) Notice: Subject to any disclaimer, the term of this patent is extended or adjusted under 35 U.S.C. 154(b) by 357 days.

(21) Appl. No.: 11/749,340

(22) Filed: May 16, 2007

(65) Prior Publication Data

US 2008/0285015 A1 Nov. 20, 2008

(51) Int. Cl.
*G01J 1/00* (2006.01)
*G01B 9/08* (2006.01)

(52) U.S. Cl. ........................ 356/213; 356/392
(58) Field of Classification Search ......... 356/213–218, 356/237.1–237.5
See application file for complete search history.

(56) References Cited

U.S. PATENT DOCUMENTS 5,072,128 A * 12/1991 Hayano et al. ......... 250/559.18

* cited by examiner

*Primary Examiner*—Michael P Stafira
(74) *Attorney, Agent, or Firm*—Wells St. John P.S.

(57) ABSTRACT

In a first aspect according to the invention there is provided a sensing system 100, suitable for sensing the stage of processing of a wafer 200, said sensing system 100 comprising receiving means 110 in the form of a first photosensitive device 110*a* and a second photosensitive device 110*b*, detector 120, a comparator 130 and a control system in the form of a programmable logic controller (PLC) 140. The first photosensitive device 110*a* receives light from the wafer 200, while the second photosensitive device 110*b* receives ambient light. The light received by the first photosensitive device 110*a* can be incident ambient light reflected off the surface of the wafer 200, refracted light radiating through the wafer 200, filtered light radiating through the wafer 200 or translucent light radiating through the wafer 200. It is further envisaged that the received light may be filtered through filters (not shown) before being received by the photosensitive devices 110*a&b*. The detector 120 then generates a wafer control signal associated with the color(s) of the light received from the wafer 200. The wafer control signal produced by the detector 120 is then compared by a comparator 130. Once the comparator 130 has compared the wafer control signal to the predetermined values, this indirectly indicates the level of processing of the wafer 200. The PLC 140 then controls the further processing of the wafer 200 according to the result of the comparison.

36 Claims, 2 Drawing Sheets

SENSING SYSTEM

FIELD OF THE INVENTION

The present invention relates to a sensing system suitable for determining the level of processing of a wafer, and in particular though not solely to a sensing system for sensing the level of processing status of a wafer chip.

BACKGROUND TO THE INVENTION

In the silicone wafer manufacturing industry, a wafer may arrive at a point on the production line in a wide variety of states of processing. Processing of silicone wafers normally changes their surface properties and/or surface texture. It is desirable to be able to automatically determine the level of processing of such a wafer during a production process so that, dependent on the level of processing, appropriate steps can be taken.

Currently, electronic sensing arrangements are used in the silicone wafer fabrication industry to detect the presence or absence of a wafer. The sensors sense the intensity of the light reflected off of a wafer to be able to detect a wafer's presence. The absence or presence of the wafer changes the amount of light received by the sensor. The quantity of light received by the sensor from a wafer can be related to the absence or presence of that wafer.

However, it is difficult to stabilize the amount of ambient light that is reflected off the wafer that may also be detected by the sensor. Further, a slight difference in the material making up the wafer may result in a slightly darker or lighter wafer, thereby resulting in false readings.

OBJECT OF THE INVENTION

It is an object of this invention to provide a sensing system that at least partially overcomes the abovementioned disadvantages and/or difficulties, or which will at least provide the public with a useful choice.

SUMMARY OF INVENTION

For the purposes of this specification, the term "wafer" is defined to mean a wafer for use in the production of integrated circuitry, whether the wafer is composed of silicone and/or any other material.

For the purposes of this specification, the term "associated with" is defined to mean "incorporating" or "utilising" or "including a function of".

In a first aspect the present invention broadly consists in a sensing system, suitable for determining the stage of processing of a wafer, said sensing system comprising:
  receiving means for receiving light from a wafer;
  detector for detecting the color of the light received and producing an associated wafer control signal;
  a comparator for comparison of the associated wafer control signal with predetermined values;
  a control system for controlling the processing of the wafer according to the result of the comparison.

The sensing system may include a plurality of receiving means and/or detector for receiving and detecting the characteristics of light from a plurality of sources.

The sensing system may further include filters for filtering the light before it is received by the receiving means.

The detector may detect the color of the light received by the receiving means by measuring the light's frequency.

The detector may detect the color of the light received by the receiving means by measuring the light's wavelength.

The detector may include a color detector.

The detector may detect the intensity of the light received from the wafer.

The receiving means may receive ambient light from the surroundings.

The detector may further detect the color of the received ambient light.

The detector may further detect the intensity of the received ambient light.

The wafer control signal may be associated with the color of the wafer in combination with any of the group consisting of
  the intensity of the light received from the wafer;
  the intensity of the ambient light; or
  the color of the ambient light.

The wafer control signal may also be associated with the color profile of the light received from the wafer or the ambient light.

The comparator may compare the wafer control signal with predetermined values.

The light received from the wafer may be reflected light from the wafer, refracted light radiating through the wafer, filtered light radiating through the wafer or translucent light radiating through the wafer.

The comparator may include comparator storage means for storing the predetermined values to be compared with the wafer control signal.

The comparator storage means may be a digital memory.

The digital memory may be a chip or a hard disk, magnetic tape, CD, or DVD.

The comparator may include comparator circuitry.

The comparator circuitry may include coupled relays.

The coupled relays may be selected from one or a combination of the group of low power relays, miniature relays or digital relays.

The predetermined values to be compared with the wafer color signal and/or the wafer intensity signal may be stored in a database.

The comparator may be a processor.

The control system may include a control storage means for storing the actions to be taken based on the result of the comparison.

The control storage means may be a digital memory.

In a second aspect the present invention broadly consists in a method of detecting the level of processing of a wafer, comprising the steps of
  receiving light from the wafer;
  determining a characteristic of the received light that is indicative of the color of the received light;
  generating an associated wafer control signal in accordance with the determined characteristic;
  comparing the wafer control signal to predetermined values; and
  controlling the processing of the wafer in accordance with the comparison.

The characteristic of the received light that is indicative of the color of the received light may be its frequency and/or wavelength.

The method may include the step of providing ambient light of a predetermined color and/or intensity.

The method may include the steps of
  determining the intensity of light from the wafer; and
  generating an associated wafer control signal in accordance with the determined intensity.

The method may further include the step of storing the predetermined values in a storage means for comparison with the wafer signal.

The method may further include the steps of
receiving ambient light from the surroundings; and
determining a characteristic of the ambient light which is indicative of the color of the ambient light.

The method may further include the step of calibrating the comparator in accordance with ambient light received from the surroundings.

The method may include the step of determining the intensity of the ambient light.

The associated wafer control signal may be generated in accordance with the color of the wafer and one of or any combination of the following:
the intensity of light received from the wafer;
the color of the ambient light; or
the intensity of the ambient light.

Other aspects of the invention may become apparent from the following description which is given by way of example only and with reference to the accompanying drawings. As used herein the term "and/or" means "and" or "or", or both.

As used herein "(s)" following a noun means the plural and/or singular forms of the noun.

The term "comprising" as used in this specification and claims means "consisting at least in part of". When interpreting statements in this specification and claims which include that term, the features, prefaced by that term in each statement, all need to be present but other features can also be present. Related terms such as "comprise" and "comprised" are to be interpreted in the same manner.

This invention may also be said broadly to consist in the parts, elements and features referred to or indicated in the specification of the application, individually or collectively, and any or all combinations of any two or more of said parts, elements or features, and where specific integers are mentioned herein which have known equivalents in the art to which this invention relates, such known equivalents are deemed to be incorporated herein as if individually set forth.)

BRIEF DESCRIPTION OF DRAWINGS

The invention will now be described by way of example only and with reference to the drawings in which.

DETAILED DESCRIPTION

Figure 1:
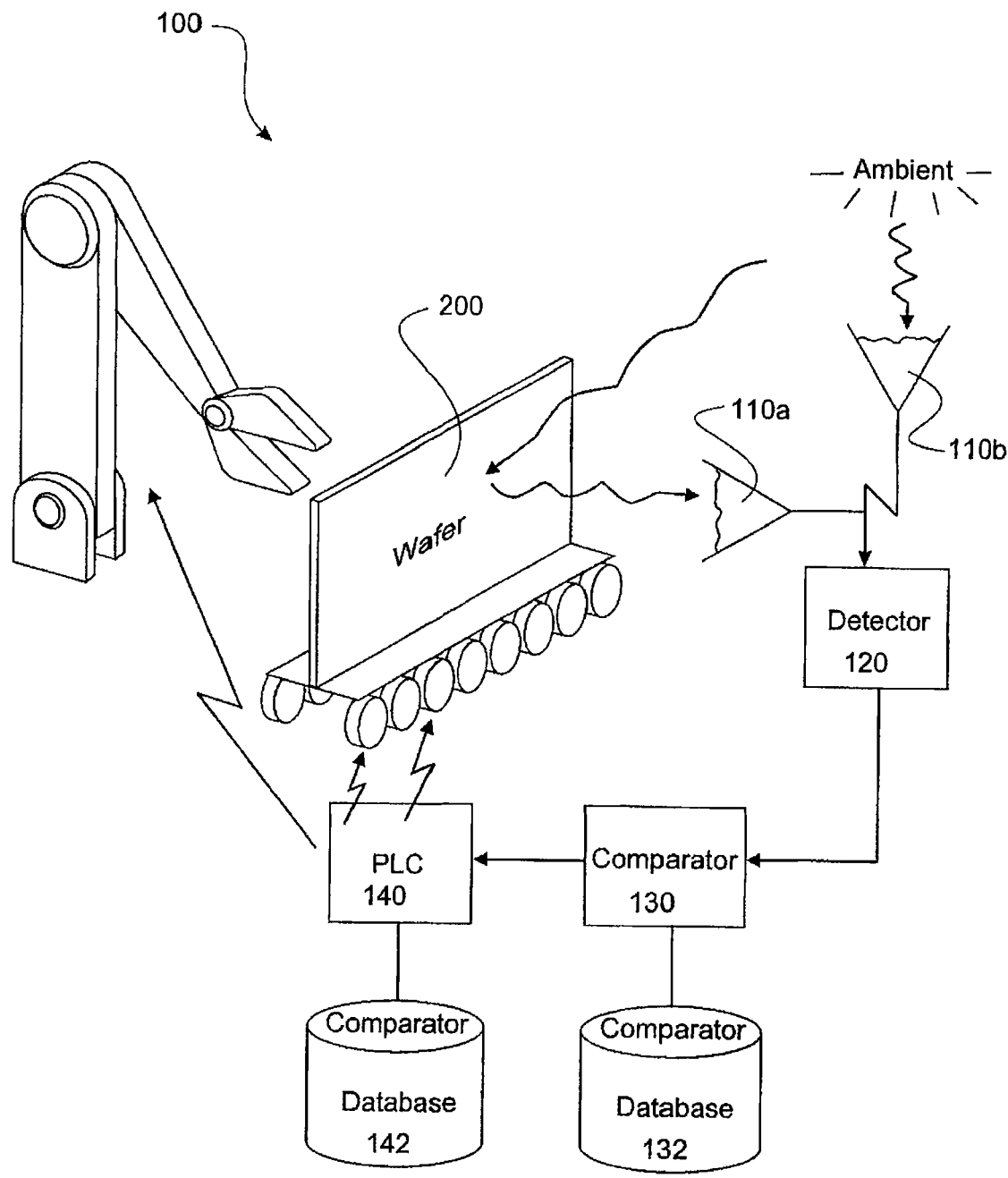
FIG. 1: shows a schematic diagram of a sensing system.
Figure 2:
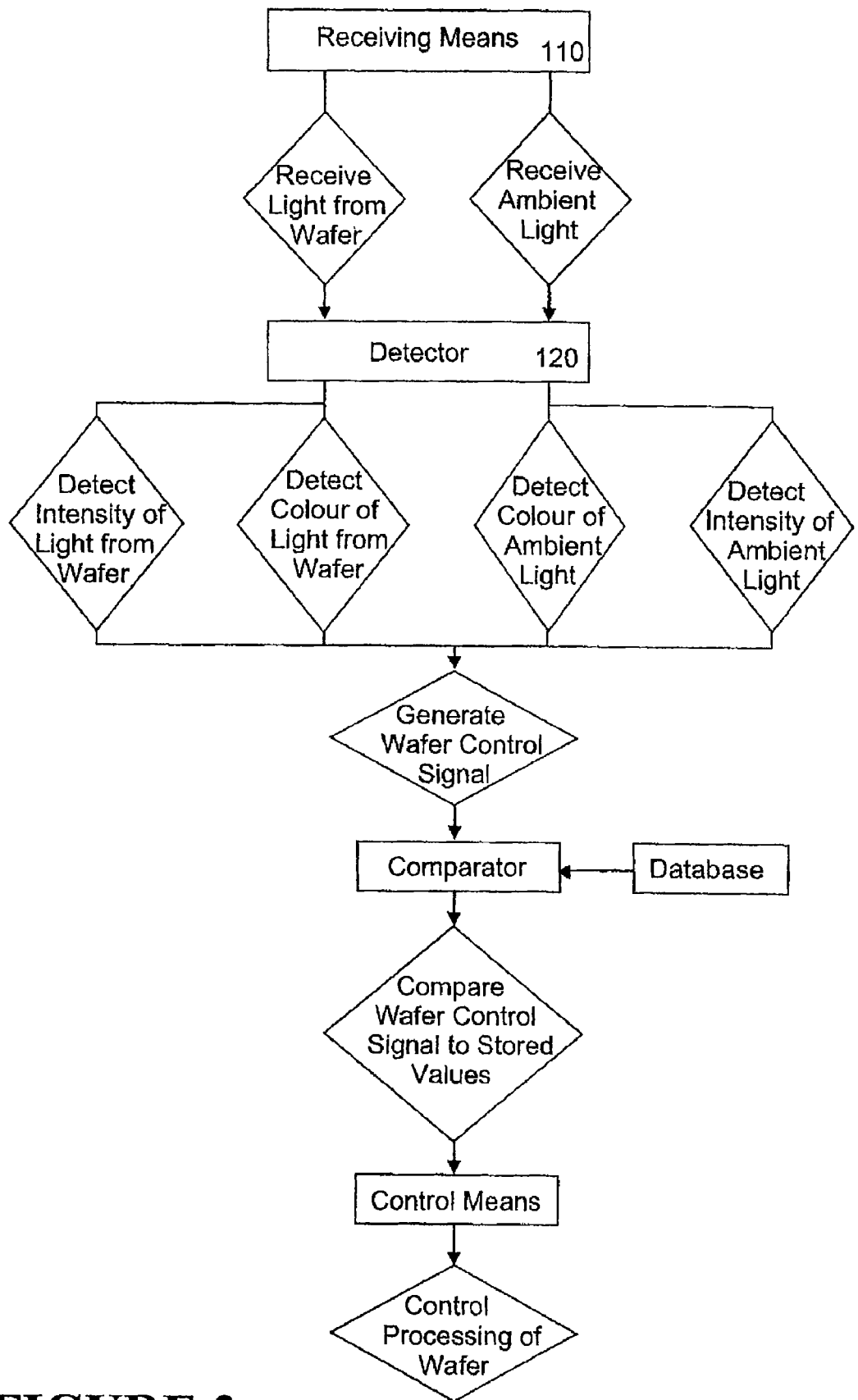
FIG. 2: shows a flow chart for a method of determining the level of processing of a wafer.

With reference to the above drawings, a sensing system according to a first aspect of the invention is generally indicated by the numeral 100.

In a first aspect according to the invention there is provided a sensing system 100, suitable for sensing the stage of processing of a wafer 200, said sensing system 100 comprising receiving means 110 in the form of a first photosensitive device 110*a* and a second photosensitive device 110*b*, detector 120, a comparator 130 and a control system in the form of a programmable logic controller (PLC) 140.

The first photosensitive device 110*a* receives light from the wafer 200, while the second photosensitive device 110*b* receives ambient light. The light received by the first photosensitive device 110*a* can be incident ambient light reflected off the surface of the wafer 200, refracted light radiating through the wafer 200, filtered light radiating through the wafer 200 or translucent light radiating through the wafer 200.

It is further envisaged that the received light may be filtered through filters (not shown) before being received by the photosensitive devices 110*a*&*b*.

The detector 120 can be any electronic system that is able to recognise the frequency and/or wavelength of the light received by the photosensitive device 100. The wavelength or frequency is indicative of the color(s) of the light received. The detector 120 can be a processor (not shown) or the like and its associated circuits (not shown). It is envisaged that the photosensitive device 110 and the detector 120 can be in a single housing (not shown). Such receivers and detectors are known and are available off the shelf, for example the Keyence Sensor CZ-V21PRGB Digital Fiber Optic Sensor APM/PNP and/or the Keyence Sensor CZ-CZ-H32 RGB Digital Fiberoptic Sensors Head/Adjustable Spot.

The detector 120 then generates a wafer control signal associated with the color(s) of the light received from the wafer 200. It is envisaged that the wafer control signal may also be associated with the color profile of the light received from the wafer 200.

It is envisaged that the detector 120 will also detect the intensity of the light received from the wafer 200, as well as the color and intensity of the ambient light. It is envisaged that the ambient light received by the second photosensitive device 110*b* is used to calibrate the comparator 130. The wafer control signal produced by the detector 120 is associated with and generated from each of these characteristics or profiles of these characteristics (of colour and/or intensity). While the embodiment described uses the color and intensity of both the light from the wafer and the ambient light to produce the wafer control signal, it is envisaged that the wafer control signal may be associated with the color of the wafer in combination with any of the group consisting of
the intensity of the light received from the wafer 200;
the intensity of the ambient light; or
the color of the ambient light It is envisaged that the ambient light color and ambient light intensity may be used to counteract the effects of the ambient light color and/or ambient light intensity on the detected color and/or intensity of the light from the wafer 200. In such a manner, a wafer control signal is produced that is more accurate and/or indicative of the "true" or corrected color of the wafer.

The wafer control signal produced by the detector 120 is then compared by a comparator 130. The comparator 130 will typically be in the form of a processor (not shown) including software for comparing the color and intensity profiles of the received light from the wafer and the ambient light. The comparator 130 will further include comparator circuitry (not shown) typically including coupled relays (not shown), which can be any one or combination of low power relays, miniature relays or digital relays.

The wafer control signal is compared to predetermined values, alternatively ranges of values, alternatively profiles of values, stored in a comparator database 132. The comparator database 132 will typically reside on a digital storage means such as a chip or a hard disk, magnetic tape, CD, or DVD. The predetermined values, alternatively ranges of values, alternatively profiles of values, will be associated with processing levels of the wafer 200. For example, a wafer 200 that has been through a particular cleaning or coating process may be expected to have a particular color that falls between two frequency or wavelength limits, and be of a certain darkness under typical ambient light conditions. If this is found to be true, then the level of processing of that wafer 200 can be established.

Once the comparator 130 has compared the wafer control signal to the predetermined values, this indirectly indicates the level of processing of the wafer 200. The PLC 140 then controls the further processing of the wafer 200 according to the result of the comparison. The PLC 140 is linked to a control database 142 stored on a digital memory (such as a chip or a hard disk, magnetic tape, CD, or DVD), that stores the information relating to the actions to be taken based on the results of the comparison. For example, if a wafer is found to have been processed to a certain level, or to have a particular coating on it, then it may be diverted from being sent to a particular processing stage and/or processing module, or the next processing stage is prevented from undertaking its steps.

It has been found that since installation of a system of the invention to a wafer processing production line, some eight incidents in the 2006 year were avoided, that would not have been avoided had a system as per the prior art been in use. These incidents would not have been avoided by use of the prior art systems, and the benefit provided by the system of the invention is invaluable in that it prevents production downtime and damage to expensive wafer treatment and processing equipment. Further, the manpower that would otherwise have been required to keep an eye out for possible failures of the prior art system is no longer required, resulting in savings in personnel costs.

Although the invention has been described by way of example and with reference to particular embodiments, it is to be understood that modifications and/or improvements may be made without departing from the scope or spirit of the invention.

The invention claimed is:

1. A sensing system, suitable for determining the stage of processing of a wafer, said sensing system comprising, in combination:
    a plurality of receiving means for receiving light and characteristics of light from a plurality of sources, wherein the plurality of receiving means receives light and characteristics of ambient light from the surroundings, and light and characteristics of light from the wafer;
    a detector for detecting the color of the light received and producing an associated wafer control signal;
    a comparator for comparison of the associated wafer control signal with predetermined values; and
    a control system for controlling the processing of the wafer according to the result of the comparison.

2. A sensing system as claimed in claim 1, including a plurality of detectors for detecting the characteristics of light from a plurality of sources.

3. A sensing system as claimed in claim 1, including filters for filtering the light before it is received by the receiving means.

4. A sensing system as claimed in claim 1, wherein the detector detects the color of the light received by the receiving means by measuring the light's frequency.

5. A sensing system as claimed in claim 1, wherein the detector detects the color of the light received by the receiving means by measuring the light's wavelength.

6. A sensing system as claimed in claim 1, wherein the detector includes a color detector.

7. A sensing system as claimed in claim 1, wherein the detector detects the intensity of the light received from the wafer.

8. A sensing system as claimed in claim 1, wherein the detector detects the color of the received ambient light.

9. A sensing system as claimed in claim 1, wherein the detector detects the intensity of the received ambient light.

10. A sensing system as claimed in claim 9, wherein the wafer control signal is associated with the color of the wafer in combination with any of the group consisting of
    the intensity of the light received from the wafer;
    the intensity of the ambient light; or
    the color of the ambient light.

11. A sensing system as claimed in claim 1, wherein the wafer control signal is associated with the color profile of the light received from the wafer.

12. A sensing system as claimed in claim 8, wherein the wafer control signal is associated with the color profile of the light received from the ambient light.

13. A sensing system as claimed in claim 1, wherein the comparator compares the wafer control signal with predetermined values.

14. A sensing system as claimed in claim 1, wherein the light received from the wafer is reflected light from the wafer.

15. A sensing system as claimed in claim 1, wherein the light received from the wafer is refracted light radiating through the wafer.

16. A sensing system as claimed in claim 1, wherein the light received from the wafer is filtered light radiating through the wafer.

17. A sensing system as claimed in claim 1, wherein the light received from the wafer is translucent light radiating through the wafer.

18. A sensing system as claimed in claim 1, wherein the comparator includes comparator storage means for storing the predetermined values to be compared with the wafer control signal.

19. A sensing system as claimed in claim 18, wherein the comparator storage means is a digital memory.

20. A sensing system as claimed in claim 19, wherein the digital memory is selected form any of the group of a chip or a hard disk, magnetic tape, CD, or DVD.

21. A sensing system as claimed in claim 1, wherein the predetermined values to be compared with the wafer color signal and/or the wafer intensity signal are stored in a database.

22. A sensing system as claimed in claim 1, wherein the comparator is a processor.

23. A sensing system as claimed in claim 1, wherein the control system includes a control storage means for storing the actions to be taken based on the result of the comparison.

24. A sensing system as claimed in claim 23, wherein the control storage means is a digital memory.

25. A sensing system as claimed in claim 1, wherein the comparator includes comparator circuitry.

26. A sensing system as claimed in claim 25, wherein the comparator circuitry includes coupled relays.

27. A sensing system as claimed in claim 26, wherein the coupled relays are selected from one or a combination of the group of low power relays, miniature relays or digital relays.

28. A method of detecting the level of processing of a wafer, comprising, in combination, the steps of:
    receiving light from the wafer;
    determining a characteristic of the received light that is indicative of the color of the received light;
    generating an associated wafer control signal in accordance with the determined characteristic;
    comparing the wafer control signal to predetermined values;
    controlling the processing of the wafer in accordance with the comparison;
    receiving ambient light from the surroundings; and determining a characteristic of the ambient light which is indicative of the color of the ambient light.

29. A method of detecting the level of processing of a wafer as claimed in claim 28, wherein the characteristic of the received light that is indicative of the color of the received light is its frequency.

30. A method of detecting the level of processing of a wafer as claimed in claim 28, wherein the characteristic of the received light that is indicative of the color of the received light is its wavelength.

31. A method of detecting the level of processing of a wafer as claimed in claim 28, including the steps of
   determining the intensity of light from the wafer; and
   generating an associated wafer control signal in accordance with the determined intensity.

32. A method of detecting the level of processing of a wafer as claimed in claim 28, including the step of storing the predetermined values in a storage means for comparison with the wafer signal.

33. A method of detecting the level of processing of a wafer as claimed in claim 28, including the step of determining the intensity of the ambient light.

34. A method of detecting the level of processing of a wafer as claimed in claim 33 wherein the associated wafer control signal is generated in accordance with the color of the wafer and one of or any combination of the following:
   the intensity of light received from the wafer;
   the color of the ambient light; or
   the intensity of the ambient light.

35. A method of detecting the level of processing of a wafer as claimed in claim 28, including the step of calibrating a comparator in accordance with ambient light received from the surroundings.

36. A method of detecting the level of processing of a wafer as claimed in claim 28, including the step of providing ambient light of a predetermined color and/or intensity.

* * * * *

UNITED STATES PATENT AND TRADEMARK OFFICE
CERTIFICATE OF CORRECTION

| | | |
|---|---|---|
| PATENT NO. | : 7,663,743 B2 | Page 1 of 1 |
| APPLICATION NO. | : 11/749340 | |
| DATED | : February 16, 2010 | |
| INVENTOR(S) | : Garcia | |

It is certified that error appears in the above-identified patent and that said Letters Patent is hereby corrected as shown below:

Col. 3, Line 40 – Replace "forth.)" – with --forth.--.

Col. 6, Line 36 – Replace "selected form" – with --selected from--.

Signed and Sealed this

Third Day of August, 2010

David J. Kappos
*Director of the United States Patent and Trademark Office*